United States Patent [19]

Kammiller

[11] Patent Number: 4,551,668
[45] Date of Patent: Nov. 5, 1985

[54] VOLTAGE SENSING AT LOADS REMOTELY CONNECTED TO POWER SUPPLIES

[75] Inventor: Neil A. Kammiller, Lakewood, Ohio

[73] Assignee: Reliance Electric Company, Cleveland, Ohio

[21] Appl. No.: 603,139

[22] Filed: Apr. 23, 1984

Related U.S. Application Data

[62] Division of Ser. No. 402,634, Jul. 28, 1982, abandoned.

[51] Int. Cl.[4] .............................................. G05F 1/46
[52] U.S. Cl. .................................... 323/234; 323/909; 340/652
[58] Field of Search ................ 323/234, 909; 340/660, 340/661, 652, 664

[56] References Cited

U.S. PATENT DOCUMENTS 3,098,192  7/1963  Levy .................................... 323/909
3,532,936 10/1970  Kuster .................................. 323/909
3,818,274  6/1974  De Witte et al. ................... 323/909

Primary Examiner—William H. Beha, Jr.
Attorney, Agent, or Firm—Michael M. Rickin

[57] ABSTRACT

A circuit for use in a power supply of the type which regulates the voltage at a load remotely connected to the output of the supply. The circuit allows the voltage at the load to be sensed so that the voltage control loop of the supply can control the load voltage in a relatively accurate manner. The circuit also provides means to detect the breakage of any one of the sense leads.

6 Claims, 3 Drawing Figures

VOLTAGE SENSING AT LOADS REMOTELY CONNECTED TO POWER SUPPLIES

This is a division of application Ser. No. 402,634, filed July 28, 1982, now abandoned.

BACKGROUND OF THE INVENTION

1. Field of the Invention

The present invention relates to power supplies with remotely located loads and more particularly to circuits adapted for use in those supplies which sense the voltage at the load as opposed to the output terminals of the supply.

2. Description of the Prior Art

In power systems the load may be located at a point which is not physically close to the output terminals of the supply. Such a non-physically close load will be referred to hereinafter by the term "remote". In every power system the load is external to the output terminals of the supply. Ordinarily the load will be within a few feet of the supply. As the operating frequency of the supply increases, the distance that the load has to be located from the supply output terminals in order to be referred to as remote decreases.

The leads connecting the load to the supply output terminals have both resistance and inductance which form, in combination with any capacitance in the load, a filter. In addition, it may also be desirable to sense the voltage at the load as opposed to sensing at the output terminals of the supply where sensing traditionally occurs. In such circumstances a pair of sensing leads either alone or as part of a wiring harness is extended to the load from the supply. These sensing leads form part of a control loop which is used to regulate the output voltage of the supply at the load. The filter described above, which arises from the combination of the resistance and inductance of the leads connecting the load to the supply output terminals and the capacitance of the load, introduces an undesirable phase shift in this control loop. This phase shift may be significant depending on how far the load is from the supply output terminals and the operating frequency of the supply. It is, therefore, desirable to minimize the effect that the undesired phase shift may have on the voltage control loop of a power supply and in particular those supplies that operate at a high frequency without compromising the desirability of sensing the voltage at the load. The term high frequency refers to those supplies which operate at a frequency which is above the audible range. Such supplies typically operate at a frequency of 20 kHz and above.

Additionally, the sense leads themselves, because of their length, may introduce erroneous signals in the form of noise into the voltage control loop. Terminating the ends of the sense leads at the supply with a capacitor may allow stray a-c signals picked up in the leads to be bypassed to ground but in turn introduces in the control loop in combination with the resistance and inductance of the sense leads additional undesirable phase shift. Use of sense leads which are both shielded and in the form of a twisted pair may minimize some of the effects that the additional undesirable phase shift introduces in the control loop. While the use of such sense leads may be effective, they do, however, add to the time for and cost of manufacturing and installing the supply. It is, therefore, also desirable that the effect of any additional phase shift and noise introduced by the sense leads themselves be minimized in a cost effective manner without compromising the desirability of sensing the voltage at the load.

Finally, as the sense leads extend some distance from the supply to the load, they then can be subject to breakage or accidental disconnection for any one of a number of reasons. Upon the breaking or accidental disconnection of a sense lead, the supply output voltage may either increase or decrease from the regulated value. While most supplies include well-known prior art circuits to sense a relatively large undervoltage or overvoltage condition in the supply's output voltage, it may, therefore, be additionally desirable to detect the breaking of the sense lead before the output voltage reaches the undervoltage or overvoltage sensing circuit threshold. Upon the detection of such a break, a suitable alarm condition may then be indicated.

SUMMARY OF THE INVENTION

In accordance with the present invention there is provided circuitry which senses the voltage at a load remotely connected to the output of a power supply in order that the supply may regulate the voltage at that load. The supply is of the type which includes voltage regulating means and the circuit of the invention has first means including leads to sense the voltage at the load and connect the sensed voltage to the input of the voltage regulating means. The invention also has second means which are between the regulating means input and the supply output to provide tight a-c coupling between the leads and the output.

The present invention also provides circuitry for sensing a break in either one or both of the pair of leads used to sense the voltage at the remotely connected load. This circuit has a current source which provides a current of predetermined polarity on the sense leads. A first detector is connected between one of the leads and one of the output terminals of the supply to generate a signal when that lead is broken. A second detector is connected between the other of the leads and the other of the output terminals to generate a signal when the associated lead is broken.

DESCRIPTION OF THE PREFERRED EMBODIMENT

Figure 1:
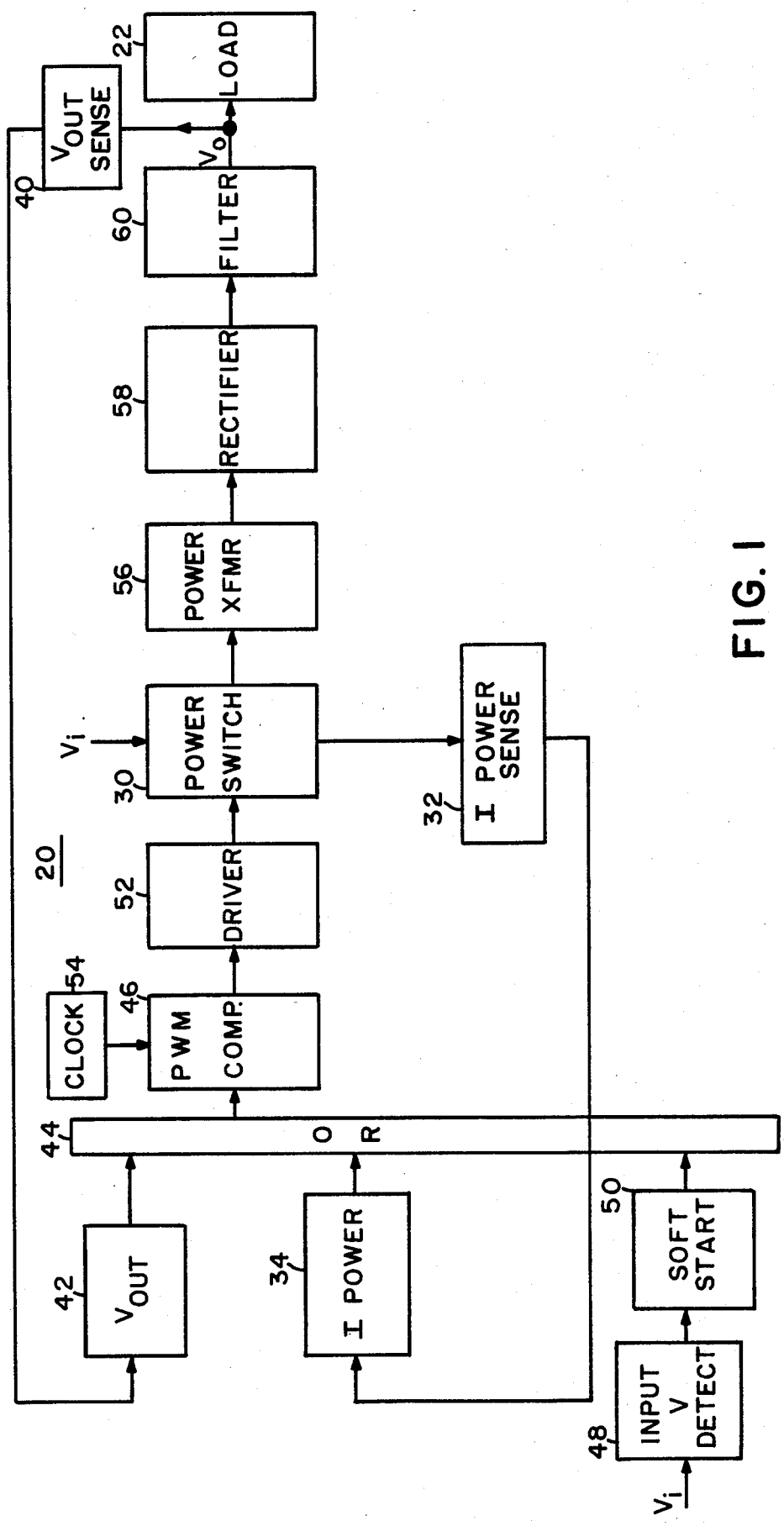
FIG. 1 is a block diagram of a typical power supply in which the present invention may be used.

Referring to FIG. 1 there is shown a block diagram for a typical high frequency power supply 20 in which the present invention may be used to sense voltage at a remotely located load 22. Supply 20 is of the type wherein a power switch 30 is turned on and off by the use of the well-known pulse width modulation (p.w.m.) technique to thereby provide from an input d-c voltage, designated as Vi, a regulated output d-c voltage, designated as Vo, having a predetermined amplitude to the load 22. The load is located at a point which is not physically close to the output terminals of the supply. The operation of supply 20 is controlled as a function of either its output voltage or current in the power switch 30. Supply 20 includes a circuit 32 which is used to monitor the current in the power switch 30. As is well known in the art, it is desirable to monitor the current in the power switch so as to be able to control the switching of switch 30 in the event that excessive current should flow therein.

The current in switch 30 may be monitored by a transformer. The sensing transformer is connected to a circuit 34 which generates a d-c signal which is representative of the current being monitored. Circuit 34 then compares that d-c signal to a predetermined reference signal. Circuit 34 may be embodied where power switch 30 comprises only a single power device by the combination of a first diode having its anode connected to one end of the secondary winding of the monitoring transformer and its cathode connected to the parallel combination of a resistor and a capacitor which provides a load for the monitoring transformer. The first diode disconnects the load when the power switch is off to thereby allow the monitoring transformer to be reset. In this manner energy which is stored in the transformer core during the time the transformer is set is not dissipated across the transformer load. Of course, when power switch 30 comprises an even number of alternately conducting power switched devices the transformer core is automatically reset by the alternately conducting device. In that case, circuit 34 does not have to include the first diode described above. A peak charging circuit, including a diode, a capacitor and a resistor, may then be connected across the transformer load to generate a d-c voltage representative of the current being monitored.

The d-c signal representative of the current is stored in the capacitor of the peak charging circuit and is one input to an operational amplifier functioning as an analog comparator. The other input to the comparator is a d-c signal which corresponds to a predetermined current. When the current being monitored reaches or exceeds the predetermined amplitude, the switching of the power switch is then controlled by circuit 34 to thereby regulate the current to the predetermined amplitude.

Supply 20 must also monitor its output voltage, Vo, to maintain regulation thereof. A sensing circuit 40 is used to provide a sample of Vo to circuit 42 which compares two voltages. One of the voltages compared by circuit 42 is simply a voltage proportional to Vo and may be obtained by use of a resistive voltage dividing network having Vo as its input voltage. The other voltage compared by circuit 42 is a reference voltage which may be provided by the combination of a zener diode and a resistive network including an adjustable resistor.

Each of the outputs of circuits 34 and 42 are provided as inputs through OR circuit 44 to p.w.m. comparator circuit 46. The output of supply 20 is then controlled by circuit 46 as a function of either the output voltage or the current in power switch 30. A clock circuit 54 provides the high frequency sawtooth waveform which circuit 46 uses in its comparison. While circuits 34, 42, 44, 46 and 54 have been shown as separate, they may be embodied by an integrated circuit chip such as the type 494 chip which is available from manufacturers such as Texas Instruments or Motorola.

Sometimes it is desirable to provide circuitry which ensures that the p.w.m. circuitry of the supply does not provide a usable output to switch 30 until such time as the input voltage to the supply reaches a predetermined amplitude. This circuitry is provided in the form of input voltage detector 48 and soft start circuit 50, the output of which is connected as another input to OR circuit 44. The input voltage to supply 20 may, for example, be provided from a d-c source such as the bank of batteries located at a typical telephone operating company central office or from the combination of a rectifier and capacitor bank (not shown) which rectifies a-c voltage to provide an unregulated d-c voltage therefrom.

Detector circuit 48 may, for example, be embodied by an operational amplifier one input of which receives a predetermined reference voltage generated from a stable source such as a zener diode in combination with a resistive voltage dividing network. The other input to the operational amplifier may be connected by a voltage dividing network to receive a voltage representative of the input voltage to supply 20. When the input voltage exceeds the reference voltage, the operational amplifier changes its state to provide a signal to soft start circuit 50.

Soft start circuit 50 may be embodied, for example, by a capacitor which prior to the change in state of the operational amplifier in circuit 48 has been held discharged by a transistor. One end of the capacitor may be connected to a predetermined voltage. The other end of the capacitor is connected to the appropriate one of the inputs of the 494 chip when the p.w.m. circuitry is so embodied. When the operational amplifier changes states, the transistor then allows the capacitor to charge down to common (OV). In response thereto the chip is activated to thereby provide a usable output to switch 30 and associated driver circuit 52.

Supply 20 also includes a power transformer 56 whose primary winding is connected in series combination with switch 30. Connected to the secondary winding of the transformer is the combination of rectifier 58 and filter 60. The circuitry which may be used to embody switch 30, transformer 56, rectifier 58 and filter 60 depends on the type of switched mode power architecture that is used for supply 20. For example, if supply 20 uses the well-known feed forward or, as it sometimes may be called, forward converter architecture, then energy is transferred to the load when power switch 20 is conducting. When the switch is turned off, part of the energy which is stored in filter 60 is transferred to the load through a commutating or free-wheeling diode (not shown) which is connected in shunt between rectifier 58 and filter 60. Rectifier 58 may be embodied in its simplest form by a diode connected in series with the secondary winding of transformer 56. Filter 60 may be embodied in its simplest form by an L-C network in which the inductor is in series with the rectifier diode. It is the energy stored in the inductor which is transferred to the load 22 during the off time of switch 30.

Figure 2A:
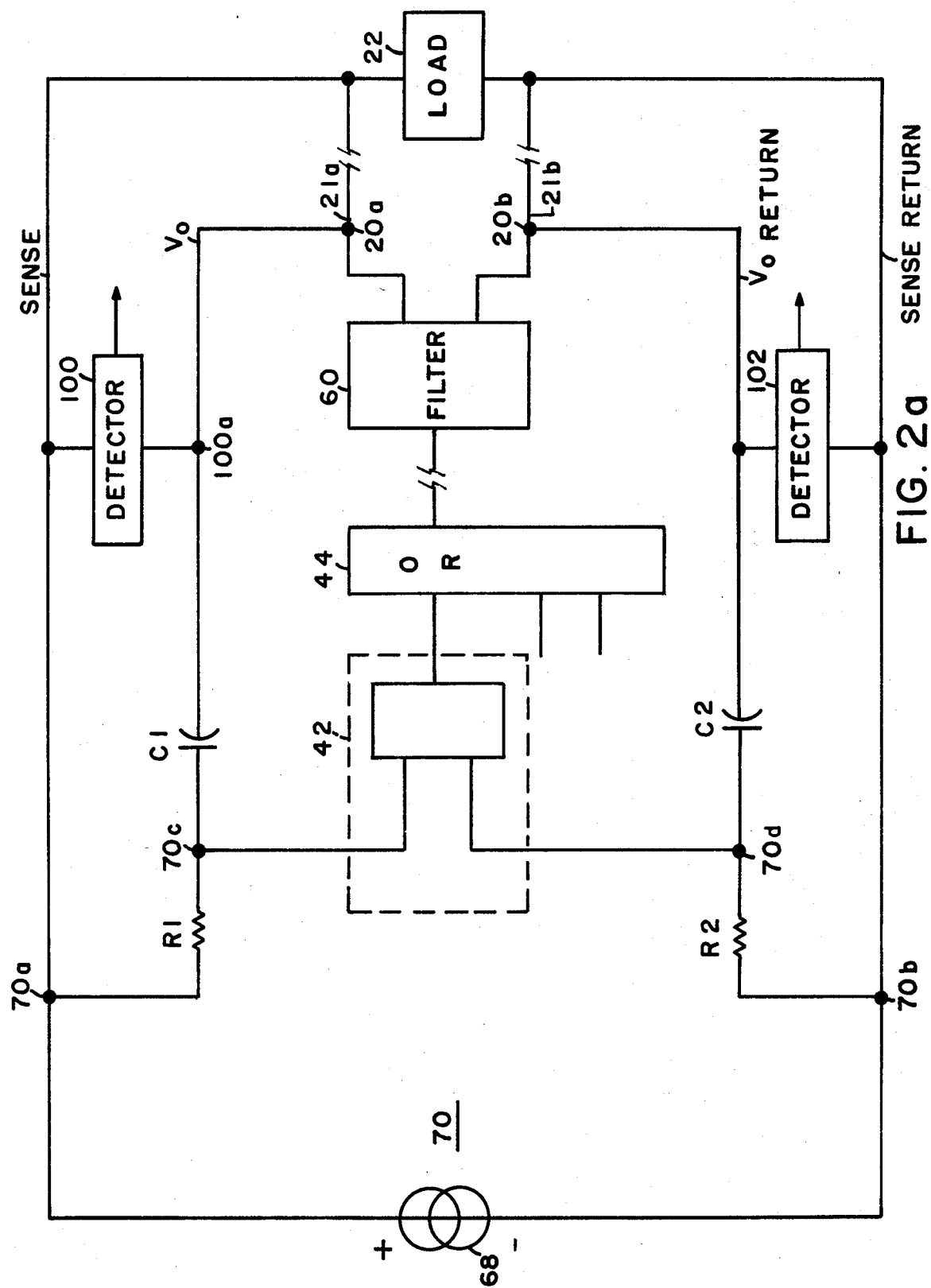
FIG. 2a is a schematic block diagram which illustrates one embodiment of the circuit of the present invention as connected to the supply shown in FIG. 1 for sensing voltage at the load.

Referring to FIG. 2a there is shown the block schematic diagram of a circuit 70 which is adapted for use in high frequency supply 20 to accomplish the desirable results of sensing at the remotely located load and simultaneously minimizing the effect of any undesirable phase shifts and noise in the voltage regulation control loop of the converter. In addition, circuit 70 also functions to detect breakage or accidental disconnection of a sense lead before the output voltage reaches the undervoltage or overvoltage sensing circuit threshold. While this circuit will be shown and described in connection with supply 20, it should be appreciated that such a circuit may also be used in any other high frequency supply which uses leads external to the supply to sense the voltage at the remote load.

The physically remote load 22 is connected to the output terminals designated as 20a and 20b in FIG. 2a of converter 20 by the leads designated as 21a and 21b, respectively. As the load may be located at a point distant from terminals 20a and 20b, leads 21a and 21b may be quite long and this is indicated symbolically in FIG. 2a. The output voltage, Vo, of converter 20 appears across terminals 20a and 20b. Also connected to the load are the leads designated as SENSE and SENSE RETURN which are used to sense the output voltage of converter 20 and provide a sample thereof to the circuit 42 (see FIG. 1) which controls the regulation of the converter output voltage.

More particularly, the SENSE lead is connected to circuit 42 by a resistor R1 while the SENSE RETURN lead is connected to circuit 42 by a resistor R2. Circuit 42 includes therein various components (not shown) which function to provide from the sensed output voltage a voltage representative of that output voltage and a fixed reference voltage. These voltages are in turn connected to a comparator (also not shown) which compares the voltage representative of converter output voltage to the reference voltage to thereby generate an error signal at the output of circuit 42. As described previously in connection with FIG. 1, the output of circuit 42 is connected to OR'ing circuit 44 along with the outputs of the circuits designated as 34 and 50 in that figure. For ease of illustration, the other circuits of supply 20 between the output of OR circuit 44 and the input of filter 60 have been omitted from FIG. 2a. In its voltage regulation mode of operation, converter 20 uses the signal generated by circuit 42 to control and thereby regulate its output voltage, Vo. While specific components have not been shown in circuit 42 for generating the voltage representative of the output voltage or the reference voltage, it should be well known to those skilled in the art that the representative voltage may be generated by a simple resistive voltage divider and the reference voltage may be generated by the series combination of a resistor and a zener diode.

As described above, the SENSE and SENSE RETURN leads are connected by resistors R1 and R2, respectively, to circuit 42. The leads are also connected by capacitors C1 and C2, respectively, to converter output terminals 20a and 20b. More specifically, the capacitor C1 is connected between the junction designated as 70c of the resistor R1 and one input to circuit 42 and the output terminal 20a and the capacitor C2 is connected between the junction designated as 70d of the resistor R2 and the other input to circuit 42 and the output terminal 20b.

It is desirable that circuit 70 minimize the detrimental effect of the phase shift introduced by the leads 21a and 21b and the phase shift and noise introduced by the SENSE and SENSE RETURN leads on the voltage regulation control loop of converter 20. As will now be described, it is resistors R1 and R2 in combination with capacitors C1 and C2 which enable circuit 70 to minimize the effects of the undesired phase shifts and noise. The output voltage of the converter is a d-c voltage and the combinations of R1 and C1 and R2 and C2 allow this voltage to be sensed at the load. In other words, for the purposes of deriving an error signal to thereby control the regulation of the output voltage of the converter, the inputs to circuit 42 are connected by the SENSE and SENSE RETURN leads to the load.

The undesired phase shift and noise are, in effect, a-c disturbances and the combination of R1 and C1 and R2 and C2 provides tight a-c coupling between the SENSE and SENSE RETURN leads and terminals 20a and 20b of the converter. This tight a-c coupling in effect makes it appear to circuit 42 that, at least with respect to a-c signals, the output voltage of the converter is being sensed at terminals 20a and 20b. Therefore, the effects of the undesired phase shifts and noise which result primarily from the length of leads 21a and 21b and the SENSE and SENSE RETURN leads are minimized in the voltage regulation control circuitry of the converter. This minimization is accomplished without the use of either shielded leads and/or a twisted pair for the SENSE and SENSE RETURN leads. While resistors R1 and R2 have been shown as discrete components of known resistance value under certain circumstances which are dependent principally on the distances of the load from terminals 20a and 20b, the resistance of the wiring used in circuit 70 may provide, without the need for additional discrete components, the desired minimization.. Thus, circuit 70 allows the converter output voltage to be sensed at the load and minimizes any undesired effects in the control loop which might arise because of the distance that load 22 is from converter output terminals 20a and 20b.

Circuit 70 also includes floating current source 68. The source 68 is connected to the SENSE and SENSE RETURN leads at the terminals of circuit 70 designated as 70a and 70b. Source 68 provides a relatively low amplitude d-c current to the SENSE and SENSE RETURN leads. Two functions result from the use of this current source. Firstly, in a standard regulating circuit containing sensing leads, when a lead breaks the voltage between the leads attempts to fall. The voltage control circuitry of the supply responds to the fall in voltage between the leads and attempts to raise the output voltage to thereby maintain the sensing leads at the regulated voltage. When the current source is present, it attempts to increase the sensing lead voltage thereby lowering the output voltage. This decrease in output voltage upon the breakage of a sensing lead is usually more desirable for the load than the increase of output voltage which would occur if the current source was not present. The amount of the voltage reduction may be limited by means of a voltage clamping device connected between junction 70c and terminal 20a, and a similar device connected between terminal 20b and junction 70d. A suitable device may, for example, be a zener diode. In addition, in an arrangement where converters are connected in parallel, the detection of a voltage reduction or an increase due to broken sensing leads may be difficult because of the masking effect of the paralleled converter. Thus, the separate detection circuitry will function independently of the resultant voltage at the output terminals.

Secondly, current source 68 is used by circuit 70 to detect breakage of the leads. A first detector 100 has a first input connected to the SENSE lead and a second input connected to terminal 20a by a lead which will be referred to hereinafter as the Vo lead. A second detector 102 has a first input connected to the SENSE RETURN lead and a second input connected to the terminal 20b by a lead which will be referred to hereinafter as the Vo RETURN lead. Source 68 may be implemented by any known floating d-c current source provided that it is isolated from the converter. While source 68 has been shown in FIG. 2a as a single source, it should be appreciated that it may in fact be two current sources, each of the same polarity as that shown for the single source. One of the two sources is connected between the SENSE and Vo leads and the other of the two sources is connected between the SENSE RETURN and Vo RETURN leads.

When the supply is operating properly and neither of the sense leads are broken, then (assuming that Vo is a positive voltage) at detector 100 the Vo lead is equal to or more positive than the SENSE lead and at detector 102 the Vo RETURN lead is equal to or more negative than the SENSE RETURN lead. The current produced by source 68 is absorbed into load 22. When either of the sense leads break, the current from source 68 that would ordinarily flow into that lead flows into the respective detector. The flow of current into the respective detector allows that detector to sense the presence of a voltage between the broken sense lead and the associated output lead.

Two examples may help in a better understanding of the operation of circuit 70 in detecting the breakage of a SENSE or SENSE RETURN lead. In each of the examples to follow it is assumed that Vo is a positive voltage. As a first example, assume that the SENSE lead breaks. Current from source 68 then flows into detector 100. This flow of current makes the terminal of detector 100 connected to the SENSE lead more positive than the terminal connected to the Vo lead. The detector, therefore, detects the presence of a voltage between the broken SENSE lead and the Vo lead. As a second example, assume that the SENSE RETURN lead breaks. Current from source 68 then flows into detector 102. The flow of current makes the terminal of detector 102 which is connected to the SENSE RETURN lead more negative than the terminal connected to the Vo RETURN lead. The detector, therefore, detects the presence of a voltage between the broken SENSE RETURN lead and the Vo RETURN lead.

Finally, while not shown in FIG. 2a, a preload in the form of a resistor may be connected in a manner well known in the art across terminals 20a and 20b whenever supply 20 operates in a condition where there is no load 22 connected to the supply. This preload aids in inhibiting any detrimental effects that the current of source 68 might have on the no load operation of the supply.

Figure 2B:
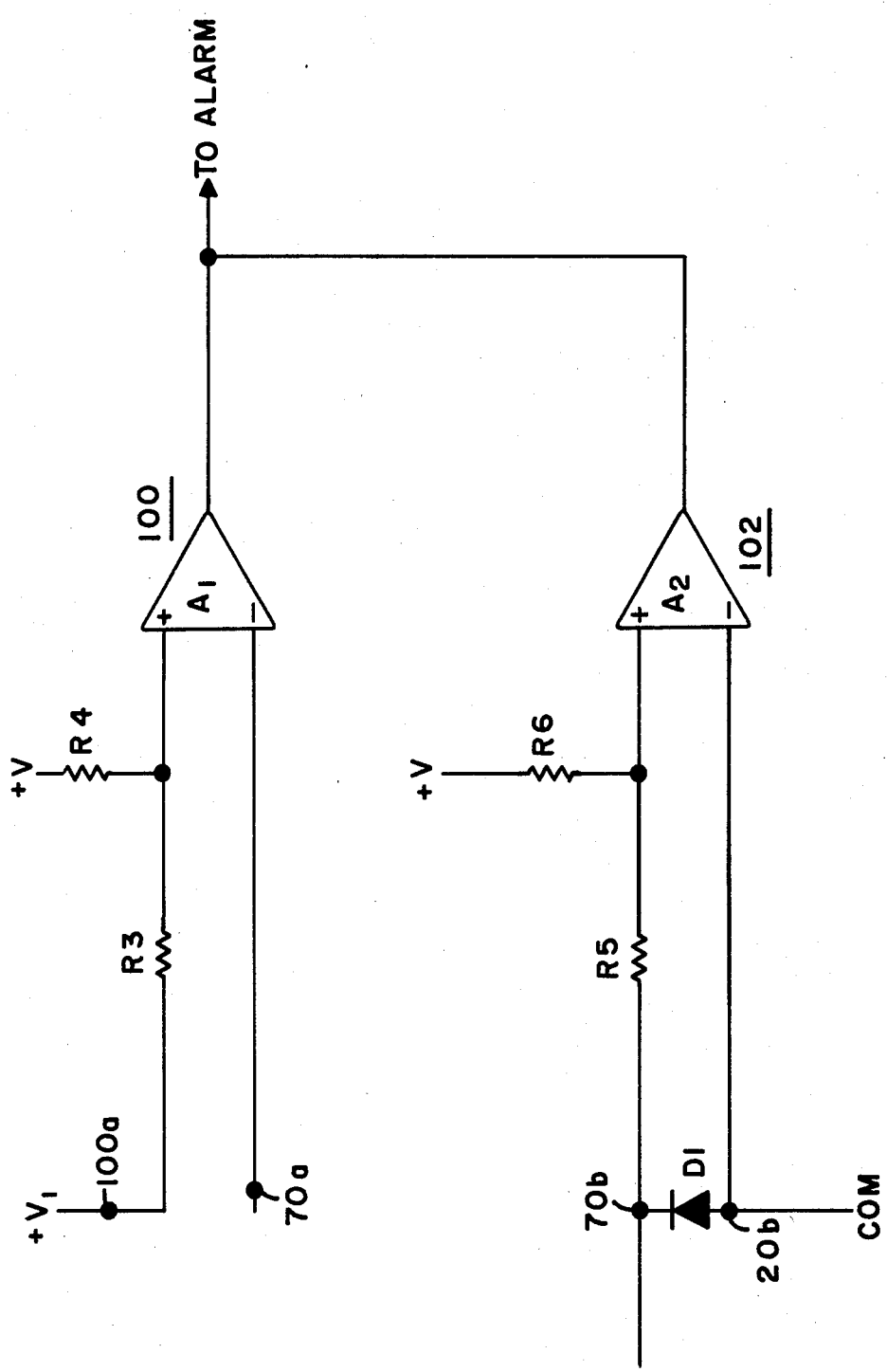
FIG. 2b is a schematic diagram of one embodiment of the circuit of the present invention for sensing breakage in a sense lead.

Referring to FIG. 2b there are shown schematic circuit diagrams for detectors 100 and 102. The first detector 100 includes an operational amplifier which functions as an analog comparator. The comparator, designated as A1, has its inverting input connected to the current source 68 at terminal 70a and, therefore, to the SENSE lead. The noninverting input of the comparator is connected by a resistor R3 to a junction 100a. Also connected to junction 100a is a d-c voltage, V1, which, dependent on the design of supply 20, may be either in the first case equal to the supply output voltage, Vo, or in the second case higher than Vo by the voltage drop of a series diode connected between the capacitor in filter 60 and the supply output.

In the first case, the junction 100a is directly connected to the supply output terminal 20a, whereas in the second case the junction 100a is connected to the supply output terminal 20a by the series diode (not shown in FIG. 2a). For either case, junction 100a may be taken as being equivalent to the supply output terminal. The noninverting input terminal of the comparator is, therefore, in effect connected through R3 to the lead designated as Vo in FIG. 2a.

The noninverting input to comparator 100 is also connected by a resistor R4 to a source of positive voltage, +V. The resistance of the resistor R4 is chosen to be many times smaller than the resistance of resistor R3 to thereby provide a small bias to the noninverting input of the comparator. This small bias ensures that at the comparator the Vo lead is (assuming Vo is a positive voltage) always more positive than the SENSE lead for all conditions of load when supply 20 operates normally.

The second detector 102 includes an operational amplifier which functions as an analog comparator. The comparator, designated as A2, has its inverting input connected to supply common (COM). This input is, therefore, connected in effect to the lead designated as Vo RETURN in FIG. 2a. The noninverting input terminal of the comparator is connected by a resistor R5 to the current source at terminal 70b and, therefore, to the SENSE RETURN lead. The noninverting terminal is also connected by a resistor R6 to a source of positive voltage, +V. As in the case of resistors R3 and R4, described above, the resistance of resistor R5 is chosen to be many times smaller than the resistance of resistor R6 to thereby provide a small bias to the noninverting input of the comparator. This small bias ensures that at the comparator the SENSE RETURN lead is (assuming that Vo is a positive voltage) always more positive than the Vo RETURN lead for all conditions of load when supply 20 operates normally.

Detector 102 also includes a diode D1, poled as shown, connected between terminal 70b and the inverting input terminal of the comparator. This diode functions to limit the amplitude of the signal at the comparator to a range which falls within the input signal amplitude specifications of the comparator. The inverting input terminal of the comparator is connected to output terminal 20b (COM) of the converter. The outputs of the comparator in detectors 100 and 102 are connected together to provide a signal to a suitably arranged alarm circuit (not shown) whenever either comparator detects a break in its associated sense lead.

The arrangement shown in FIG. 2b for detectors 100 and 102 causes the output voltage of the source to fall when a SENSE or SENSE RETURN lead breaks. Alternatively, the input SENSE and SENSE RETURN polarities to each detector may be reversed from those shown. In that case, the current sources associated with the SENSE and SENSE RETURN leads must be also reversed in polarity from that shown for source 68. In addition, it is no longer necessary for each source to be isolated from the converter. Each of the sources may, therefore, be more simply embodied in the manner described below. The source associated with the SENSE lead and, therefore detector 100, may be embodied by connecting a current limiting resistor (not shown) between terminal 104a and the Vo RETURN lead. The source associated with the SENSE RETURN lead, and therefore with detector 102, may be embodied also by connecting a current limiting resistor (not shown) between terminal 70b and the Vo lead. The current generated by each source will, therefore, have a polarity opposite to that shown in FIG. 2b for source 68. This opposite polarity current will cause the output voltage of the source to rise when either a SENSE or SENSE RETURN lead is broken.

In a circuit constructed in accordance with the present invention, the following component values were used:

R1=R2=1×10³ ohms
C1=C2=2200 microfarads
R3=R5=681 ohms
R4=R6=21.1×10³ ohms

While the present invention has been described in connection with the type of high frequency power supply shown in FIG. 1, it should be appreciated that the invention is also applicable to any type of high frequency power supply which senses voltage at a remotely located load. It should also be appreciated that the invention may provide an improvement in the voltage sensing at remotely located loads for those power supplies which operate at low frequency. Such low frequency supplies typically operate in the order of 50 or 60 Hertz. At these low operating frequencies, the phase shift introduced in the voltage control loop by the remote sensing is not as detrimental to supply operation as the phase shift introduced in the voltage control loop of high frequency supplies. Yet, it may still be desirable in such low frequency supplies to minimize the effect that this phase shift has on supply operation. In addition, it is always desirable, no matter at what frequency the supply operates, to detect breakage of a sense lead if the supply is of the type which senses voltage at its remotely connected load.

It is to be understood that the descriptions of the preferred embodiments are intended to be only illustrative, rather than exhaustive, of the present invention. Those of ordinary skill will be able to make certain additions, deletions and/or modifications to the embodiments of the disclosed subject matter without departing from the spirit of the invention or its scope, as defined by the appended claims.

What is claimed is:

1. A circuit for sensing a break in at least one of a pair of sense leads in a power supply of the type which regulates the voltage at a remotely located load connected to said supply at its pair of output terminals said sense leads being connected to sense the voltage at said load, said circuit comprising:

(a) current source means connected to said sense leads to provide a current of predetermined polarity thereon;
   (b) first detector means connected between one of said sense leads and one of said output terminals for generating a signal when said one sense lead is broken; and
   (c) second detector means connected between the other of said sense leads and the other of said output terminals for generating a signal when said other sense lead is broken.

2. The circuit of claim 1 wherein said current source means is a single source of current connected between said pair of sense leads.

3. The circuit of claim 1 wherein said current source means comprises a first current source connected between one of said sense leads and one of said output terminals and a second current source connected between the other of said sense leads and the other of said output terminals each of said current sources having the same polarity as said current source means.

4. The circuit of claim 1 wherein said first detector means includes a first comparator means connected between said one sense lead and said one output terminal and said second detector means includes a second comparator means connected between said other sense lead and said other output terminal.

5. The circuit of claim 1 wherein said first and second detector means each have outputs which are interconnected so that either of said signals generated by said first and second detector means may be used to provide a signal to a suitably arranged alarm indicative of lead breakage.

6. The circuit of claim 4 wherein said first and second detector means each have outputs which are interconnected so that either of said signals generated by said first and second detector means may be used to provide a signal to a suitably arranged alarm indicative of lead breakage.

* * * * *